(12) United States Patent
Tanio

(10) Patent No.: US 12,556,435 B2
(45) Date of Patent: Feb. 17, 2026

(54) SIGNAL MODULATION APPARATUS AND SIGNAL MODULATION METHOD

(71) Applicant: NEC Corporation, Tokyo (JP)

(72) Inventor: Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 33 days.

(21) Appl. No.: 18/592,793

(22) Filed: Mar. 1, 2024

(65) Prior Publication Data

US 2024/0314005 A1 Sep. 19, 2024

(30) Foreign Application Priority Data

Mar. 16, 2023 (JP) .................. 2023-041718

(51) Int. Cl.
*H04L 25/49* (2006.01)
*H03K 4/02* (2006.01)
*H03K 7/08* (2006.01)

(52) U.S. Cl.
CPC ......... *H04L 25/4902* (2013.01); *H03K 4/026* (2013.01); *H03K 7/08* (2013.01)

(58) Field of Classification Search
CPC ......... H04L 25/38; H04L 25/40; H04L 25/49; H04L 25/4902; H03K 7/00; H03K 7/08; H03K 4/02; H03K 4/026; H03K 4/04; H03K 4/08; H03K 4/48; H03K 4/60; H03K 4/62; H03K 4/625; H03K 4/68; H03K 4/83; H03K 4/835
See application file for complete search history.

(56) References Cited

U.S. PATENT DOCUMENTS

| | | | | |
|---|---|---|---|---|
| 5,739,643 A | * | 4/1998 | Usui | H05B 41/30 315/200 A |
| 6,433,496 B1 | * | 8/2002 | Kawagoshi | H02P 6/085 318/459 |
| 7,394,862 B2 | * | 7/2008 | Jensen | H04L 27/367 375/295 |
| 7,477,694 B2 | * | 1/2009 | Sanderford, Jr. | H04L 27/364 375/261 |
| 7,518,444 B2 | * | 4/2009 | Andersen | H03F 1/32 330/10 |

(Continued)

OTHER PUBLICATIONS

Ibrahim Can Sezgin et al., "All-Digital, Radio-Over-Fiber, Communication Link Architecture for Time-Division Duplex Distributed Antenna Systems", Journal of Lightwave Technology, vol. 39, No. 9, pp. 2769-2779, May 1, 2021.

*Primary Examiner* — James M Perez
(74) *Attorney, Agent, or Firm* — Sughrue Mion, PLLC

(57) ABSTRACT

A signal modulation apparatus includes: a reference signal generator that generates an analog reference signal by removing at least one harmonic signal component corresponding to at least one higher-order frequency from a triangular wave signal; a modulation signal generator that performs pulse width modulation for comparing the analog reference signal with an analog input signal, thereby to generate an analog modulation signal; a digital signal converter that converts the analog modulation signal to a digital output signal; and a nonlinear converter that performs nonlinear conversion corresponding to waveform conversion for converting the triangular wave signal to the analog reference signal, on the digital output signal or the analog input signal.

10 Claims, 10 Drawing Sheets

(56) References Cited

U.S. PATENT DOCUMENTS

| | | | | |
|---|---|---|---|---|
| 8,374,228 | B2* | 2/2013 | Sanderford, Jr. | H04L 27/2331 |
| | | | | 455/456.6 |
| 8,912,833 | B2* | 12/2014 | Braun | H03M 3/506 |
| | | | | 327/172 |
| 9,094,022 | B2* | 7/2015 | Sanderford, Jr. | H04L 27/32 |
| 9,112,515 | B2* | 8/2015 | Sanderford, Jr. | H04L 27/3483 |
| 9,431,973 | B2* | 8/2016 | Chappaz | H03F 3/183 |
| 10,367,480 | B1* | 7/2019 | Kreider | H03K 3/017 |
| 10,574,199 | B2* | 2/2020 | Hori | H03F 3/24 |
| 10,841,137 | B2* | 11/2020 | Spagnolini | H04L 25/4902 |
| 2004/0056627 | A1* | 3/2004 | Grasso | H02M 7/53875 |
| | | | | 318/599 |
| 2006/0077760 | A1* | 4/2006 | Tsubota | H03K 7/08 |
| | | | | 367/137 |
| 2011/0254636 | A1* | 10/2011 | Chen | H03K 7/08 |
| | | | | 332/108 |
| 2012/0002755 | A1* | 1/2012 | Chen | H03K 7/08 |
| | | | | 375/302 |
| 2012/0113698 | A1* | 5/2012 | Inoue | H02M 7/4835 |
| | | | | 363/123 |
| 2016/0254786 | A1* | 9/2016 | Takahashi | H03F 3/2173 |
| | | | | 330/251 |
| 2018/0159632 | A1* | 6/2018 | Spagnolini | H04B 10/2587 |
| 2018/0331665 | A1* | 11/2018 | Hori | H03F 1/56 |
| 2020/0328917 | A1* | 10/2020 | Spagnolini | H04L 25/4902 |
| 2022/0271786 | A1* | 8/2022 | Jacobsson | H04B 1/44 |
| 2024/0128860 | A1* | 4/2024 | Wang | H02M 7/06 |
| 2024/0146587 | A1* | 5/2024 | Tanio | H04L 27/2096 |
| 2024/0314005 | A1* | 9/2024 | Tanio | H04L 25/4902 |
| 2025/0159405 | A1* | 5/2025 | Thomsen | H04R 19/02 |

* cited by examiner

SIGNAL MODULATION APPARATUS AND SIGNAL MODULATION METHOD

INCORPORATION BY REFERENCE

This application is based upon and claims the benefit of priority from Japanese Patent Application No. 2023-041718, filed on Mar. 16, 2023, the disclosure of which is incorporated herein in its entirety by reference.

TECHNICAL FIELD

Example embodiments of this disclosure relate to technical fields of a signal modulation apparatus and a signal modulation method that generate an analog modulation signal by performing pulse width modulation on an analog input signal.

BACKGROUND ART

For a wireless access system used in a mobile network, there is known a wireless access system including: a plurality of slave stations (e.g., access points) each of which include an antenna; and a master station (e.g., a centralized control station) that controls the plurality of slave stations. In such a wireless access system, a method of performing transmission using pulse width modulation (PWM) is proposed as a method for realizing at least one of miniaturization and cost reduction of the access point. For example, Non-Patent Literature 1 describes a technique/technology in which the slave station generates a pulse width modulation signal by performing the pulse width modulation on an input signal to be transmitted from the slave station to the master station, and the slave station transmits the pulse width modulation signal to the master station. Since the wireless access system performs the pulse width modulation, the wireless access system may be referred to as a signal modulation apparatus.

PRIOR ART DOCUMENTS

Non-Patent Literature

[Non-Patent Literature 1]
Ibrahim Can Sezgin et al., "All-Digital, Radio-Over-Fiber, Communication Link Architecture for Time-Division Duplex Distributed Antenna Systems", Journal of Lightwave Technology, Vol. 39, No. 9, pp. 2769-2779 May 1, 2021

To perform the pulse width modulation, normally, a comparator generates a pulse width modulation signal by comparing a triangular wave signal (typically, an analog triangular wave signal) with an input signal (typically, an analog input signal). The analog triangular wave signal is generally generated from a digital triangular wave signal that discretely indicates a signal value of the analog triangular wave signal. Specifically, a DA (Digital to Analog) converter that is configured to convert a digital signal to an analog signal, generates an analog triangular wave signal that discretely indicates a signal value of the analog triangular wave signal, from the digital triangular wave signal. The analog triangular wave signal generated by the DA converter is used as the triangular wave signal used for the pulse width modulation.

Here, as a bandwidth of the input signal becomes wider, frequency of the triangular wave signal becomes higher. As the frequency of the triangular wave signal becomes higher, a sampling frequency required for the DA converter used to generate the triangular wave signal becomes higher. This causes a technical problem of an increased cost of the DA converter. That is, a cost required to perform the pulse width modulation increases, which is technically problematic.

Such a technical problem may arise not only in the wireless access system including the plurality of slave stations and the master station, but also in any apparatus that performs the pulse width modulation on the input signal.

SUMMARY

It is an example object of this disclosure to provide a signal modulation apparatus and a signal modulation method that are capable of solving the above-described technical problems. By way of illustration, it is an example object of this disclosure to provide a signal modulation apparatus and a signal modulation method for which the cost required to perform the pulse width modulation is reduced.

A signal modulation apparatus according to an example aspect of this disclosure includes: a reference signal generator that generates an analog reference signal by removing at least one harmonic signal component corresponding to at least one higher-order frequency from a triangular wave signal; a modulation signal generator that performs pulse width modulation for comparing the analog reference signal with an analog input signal, thereby to generate an analog modulation signal; a digital signal converter that converts the analog modulation signal to a digital output signal; and a nonlinear converter that performs nonlinear conversion corresponding to waveform conversion for converting the triangular wave signal to the analog reference signal, on the digital output signal or the analog input signal.

A signal modulation method according to an example aspect of this disclosure includes: generating an analog reference signal by removing at least one harmonic signal component corresponding to at least one higher-order frequency from a triangular wave signal; performing pulse width modulation for comparing the analog reference signal with an analog input signal, thereby to generate an analog modulation signal; converting the analog modulation signal to a digital output signal; and performing nonlinear conversion corresponding to waveform conversion for converting the triangular wave signal to the analog reference signal, on the digital output signal or the analog input signal.

Effect

According to the signal modulation apparatus and the signal modulation method in the respective example aspects, it is possible to reduce the cost required to perform the pulse width modulation.

EXAMPLE EMBODIMENTS

Hereinafter, a signal modulation apparatus and a signal modulation method according to example embodiments will be described with reference to the drawings. In the following description, the signal modulation apparatus and the signal modulation method according to the example embodiments will be described, by using a wireless access system SYS to which the signal modulation apparatus and the signal modulation method according to the example embodiments are applied. This disclosure, however, is not limited to the example embodiments described below.

<1> Wireless Access System SYS in First Example Embodiment

First, a wireless access system SYS in the first example embodiment will be described. In the following description, the wireless access system SYS in the first example embodiment is referred to as a wireless access system SYSa for convenience of description.

Figure 1:
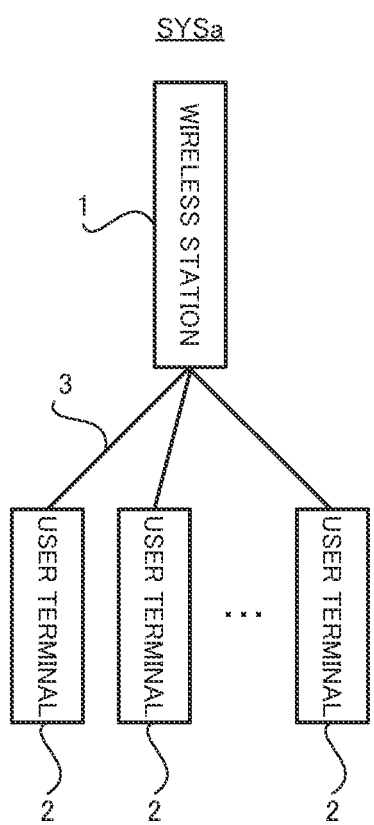
FIG. 1 is a block diagram illustrating a configuration of a wireless access system in a first example embodiment.

<1-1> Overall Configuration of Wireless Access System SYSa in First Example Embodiment First, a configuration of the wireless access system SYSa in the first example embodiment will be described with reference to FIG. 1. FIG. 1 is a block diagram illustrating the configuration of the wireless access system SYSa according to the first example embodiment.

As illustrated in FIG. 1, the wireless access system SYSa includes a wireless station 1. Although FIG. 1 illustrates the wireless access system SYSa including a single wireless station 1, the wireless access system SYSa may include a plurality of wireless stations 1.

The wireless station 1 is configured to communicate wirelessly with at least one user terminal 2 through a wireless network 3. The wireless network 3 may mean a network that is capable of transmitting information by using a radio wave. An example of the user terminal 2 is a mobile phone. For example, the wireless station 1 may generate a radio downlink signal to be transmitted to the user terminal 2, and may transmit the radio downlink signal to the user terminal 2 through the wireless network 3. For example, the wireless station 1 may receive a radio uplink signal RUS (see FIG. 2) from the user terminal 2 through the wireless network 3.

Such a wireless access system SYSa may typically be used for a mobile communication system. For example, the wireless access system SYSa may be used for a fifth-generation mobile communication system that meets IMT-2020 specifications issued by ITU (International Telecommunication Union). For example, the wireless access system SYSa may be used for a mobile communication system referred to as Beyond 5G.

<1-2> Signal Conversion Method Performed by Using Wireless Access System SYSa

Next, a signal conversion method performed by using the wireless access system SYSa will be described. In particular, the signal conversion method performed by using the wireless access system SYSa will be described below with reference to FIG. 2 that is a block diagram illustrating a configuration of the wireless station 1.

Furthermore, for convenience of description, the signal conversion method performed by the wireless station 1 that has received the uplink signal to be transmitted from the user terminal 2 to the wireless station 1 will be described below. As the signal conversion method performed by the wireless station 1 to transmit the downlink signal to be transmitted from the wireless station 1 to the user terminal 2, an existing signal conversion method may be used.

Figure 2:
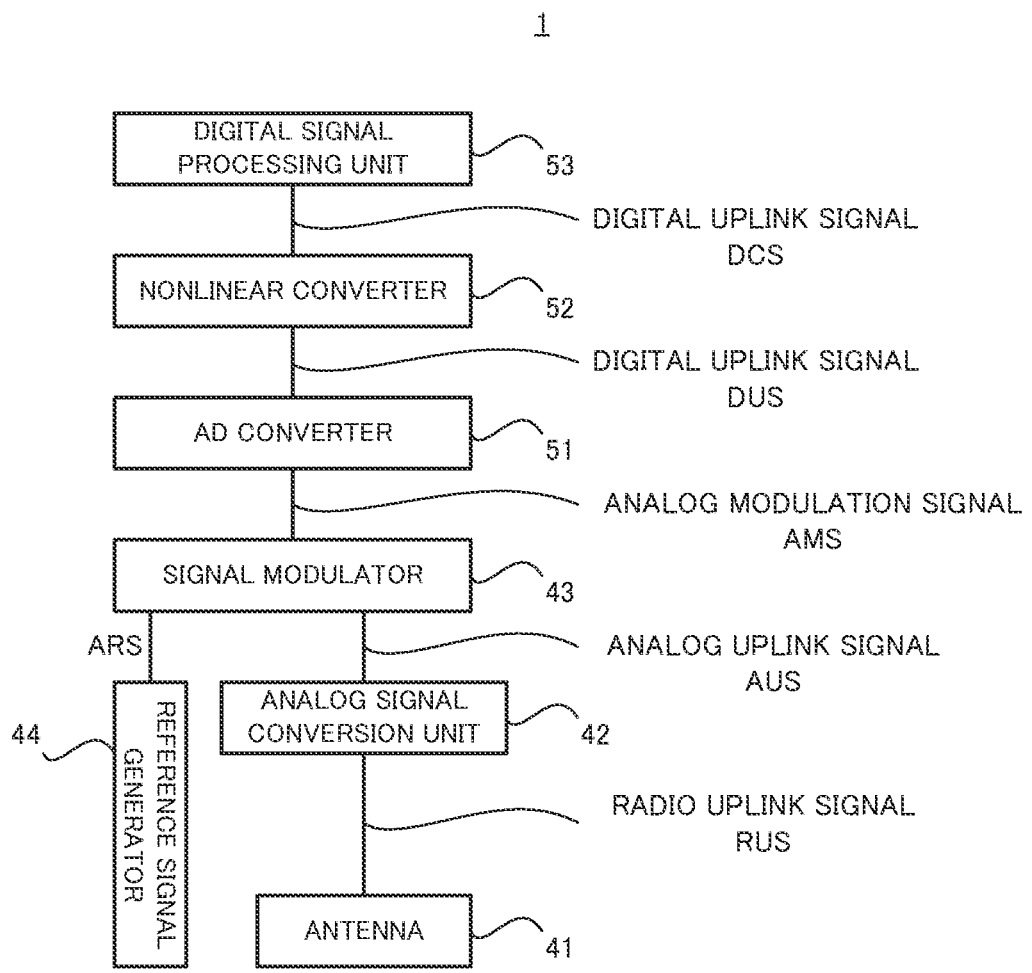
FIG. 2 is a block diagram illustrating a configuration of a wireless station in the first example embodiment.

As illustrated in FIG. 2, the wireless station 1 includes an antenna 41, an analog signal conversion unit 42, a signal modulator 43, a reference signal generator 44, an AD (Analog to Digital) converter 51, a nonlinear converter 52, and a digital signal processing unit 53.

The signal modulator 43 may be referred to as a "modulation signal generator." The reference signal generator 44 may be referred to as a "reference signal generator." The AD converter 51 may be referred to as a "digital signal converter" or a "digital signal converter". The nonlinear converter 52 may be referred to as a "nonlinear converter" or a "nonlinear converter." The wireless station 1 may be referred to as a "signal modulation apparatus."

The antenna 41 receives a radio uplink signal RUS that is an analog radio signal (RF signal), from the user terminal 2 through the radio network 3. The radio uplink signal RUS received by the antenna 41 is inputted from the antenna 41 to the analog signal conversion unit 42.

Figure 3:
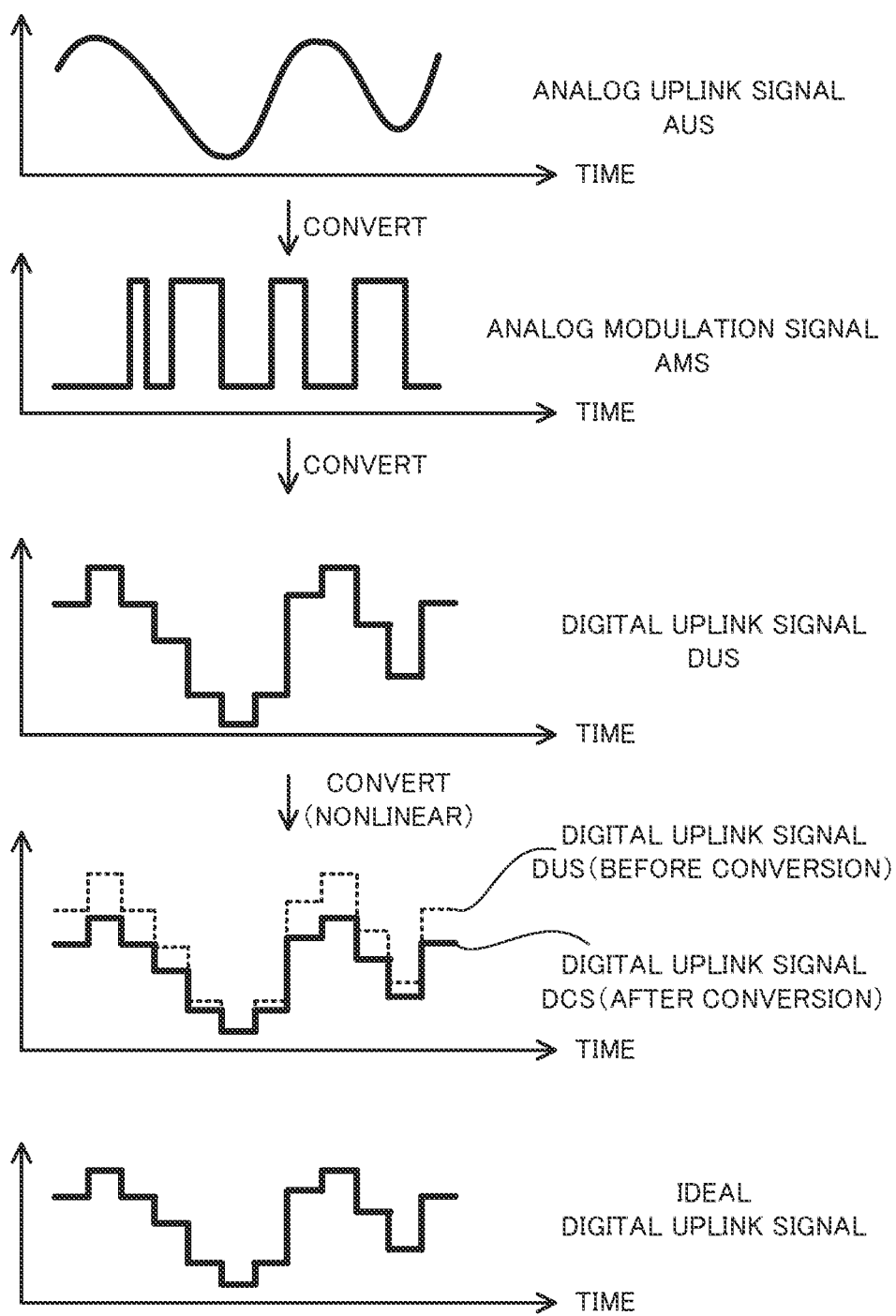
FIG. 3 is a diagram illustrating a waveform of each signal generated in a signal conversion method performed by using a wireless access system.

The analog signal conversion unit 42 performs predetermined analog signal conversion on the radio uplink signal RUS, thereby to generate an analog uplink signal AUS that is an analog electrical signal. The analog uplink signal AUS may be referred to as an analog input signal. The analog signal conversion may include signal amplification that amplifies the radio uplink signal RUS. The analog signal conversion may include a noise removal operation that removes a noise component from the radio uplink signal RUS. The noise removal operation may include an operation of removing a low-frequency component as the noise component by using a low pass filter (LPF). The analog signal conversion may include a down-conversion operation of down-converting the radio uplink signal RUS to a signal in a frequency band that is lower than a frequency band of the radio uplink signal RUS. By way of illustration, the analog signal conversion may include a down-conversion operation of down-converting the radio uplink signal RUS to the analog uplink signal AUS in a band of 2 GHz (gigahertz, the same applies hereinafter) that is lower than a band of 100 GHz that is a frequency band of the radio uplink signal RUS. An example of the analog uplink signal AUS generated by such analog signal conversions is illustrated in FIG. 3. The analog uplink signal AUS generated by the analog signal conversion unit 42 is inputted from the analog signal conversion unit 42 to the signal modulator 43.

The signal modulator 43 performs predetermined modulation on the analog uplink signal AUS, thereby to generate an analog modulation signal AMS that is an analog electrical signal. The first example embodiment describes an example in which the signal modulator 43 performs pulse width modulation on the analog uplink signal AUS, thereby to generate the analog modulation signal AMS. In this instance, the signal modulator 43 uses an analog reference signal ARS to perform the pulse width modulation on the analog uplink signal AUS. Specifically, the signal modulator 43 compares the analog reference signal ARS with the analog uplink signal AUS by using a comparator. That is, the signal modulator 43 compares a signal level of the analog reference signal ARS with that of the analog uplink signal AUS by using a comparator. Consequently, the signal modulator 43 generates the analog modulation signal AMS that is an analog pulse signal in which a pulse width varies depending on the signal level of the analog uplink signal AUS.

An example of the analog modulation signal AMS generated by such pulse width modulation is illustrated in FIG. 3. The analog modulation signal AMS is an analog electrical signal, but is also a pulse signal. That is why, as illustrated in FIG. 3, a signal level of the analog modulation signal AMS at each time is substantially one of binary levels including a low level and a high level.

The analog reference signal ARS used by the signal modulator 43 to perform the pulse width modulation is generated by the reference signal generator 44. That is, the analog reference signal ARS is an analog electrical signal generated by the reference signal generator 44.

Figure 4:
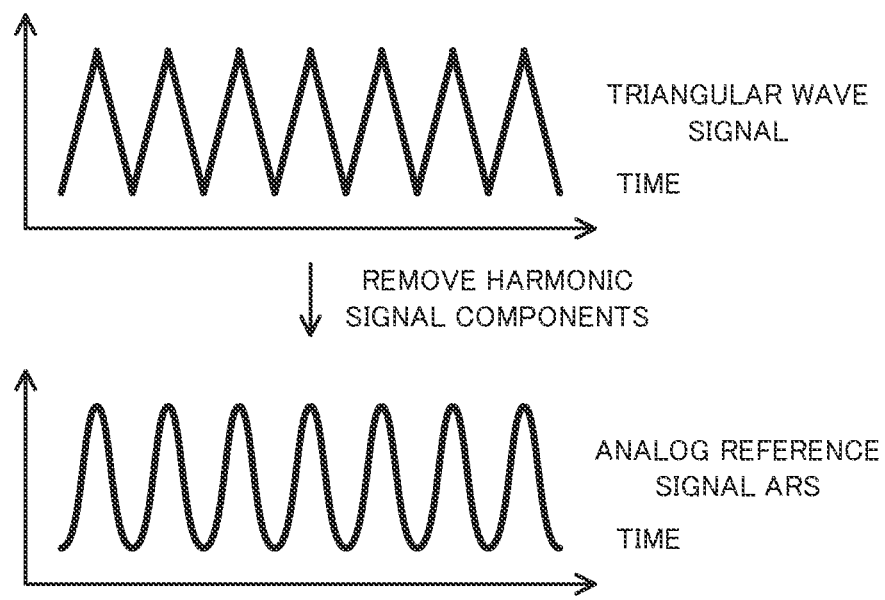
FIG. 4 is a diagram illustrating a waveform of an analog reference signal, along with a waveform of a triangular wave signal.

To perform the pulse width modulation, a triangular wave signal (in this case, an analog triangular wave signal that is an analog electrical signal) is often used as the analog reference signal ARS. On the other hand, in the first example embodiment, a signal that is different from the triangular wave signal is used as the analog reference signal ARS. Specifically, in the first example embodiment, as illustrated in FIG. 4 that illustrates a waveform of the analog reference signal ARS, a signal acquired by removing from the triangular wave signal at least one harmonic signal component corresponding to at least one higher-order frequency, is generated as the analog reference signal ARS. That is, the reference signal generator 44 generates, as the analog reference signal ARS, a signal acquired by removing from the triangular wave signal at least one harmonic signal component corresponding to at least one higher-order frequency.

Specifically, the triangular wave signal is a signal with a triangular or sawtooth signal waveform. Such a triangular wave signal is usually a signal acquired by combining a fundamental signal component corresponding to a fundamental frequency and the harmonic signal component corresponding to the higher-order frequency. The high-order frequency may mean a frequency of an integer multiple (e.g., an odd multiple) of the fundamental frequency. For example, the triangular wave signal may be a signal acquired by combining a signal component corresponding to the fundamental frequency and a single signal component corresponding to a single higher-order frequency. For example, the triangular wave signal may be a signal acquired by combining the fundamental signal component corresponding to the fundamental frequency and a plurality of harmonic signal components corresponding respectively to a plurality of higher-order frequencies. In the first example embodiment, a signal acquired by removing at least one harmonic signal component included in the triangular wave signal, from the triangular wave signal including one or a plurality of harmonic signal components, is used as the analog reference signal ARS.

The reference signal generator 44 may generates a signal acquired by removing M (M is a variable indicating an integer of 1 or more and less than N) harmonic signal components from the triangular wave signal including N (N is a variable indicating an integer of 1 or more) harmonic signal components corresponding respectively to N high-order frequencies, as the analog reference signal ARS. That is, the reference signal generator 44 may generate, as the analog reference signal ARS, a signal acquired by selectively removing from the triangular wave signal a part of the harmonic signal components o included in the triangular wave signal.

The reference signal generator 44 may generate, as the analog reference signal ARS, a signal acquired by removing N harmonic signal components from the triangular wave signal including the N harmonic signal components corresponding respectively to N higher-order frequencies. That is, the reference signal generator 44 may generate, as the analog reference signal ARS, a signal acquired by removing from the triangular wave signal all the harmonic signal components included in the triangular wave signal.

Figure 5:
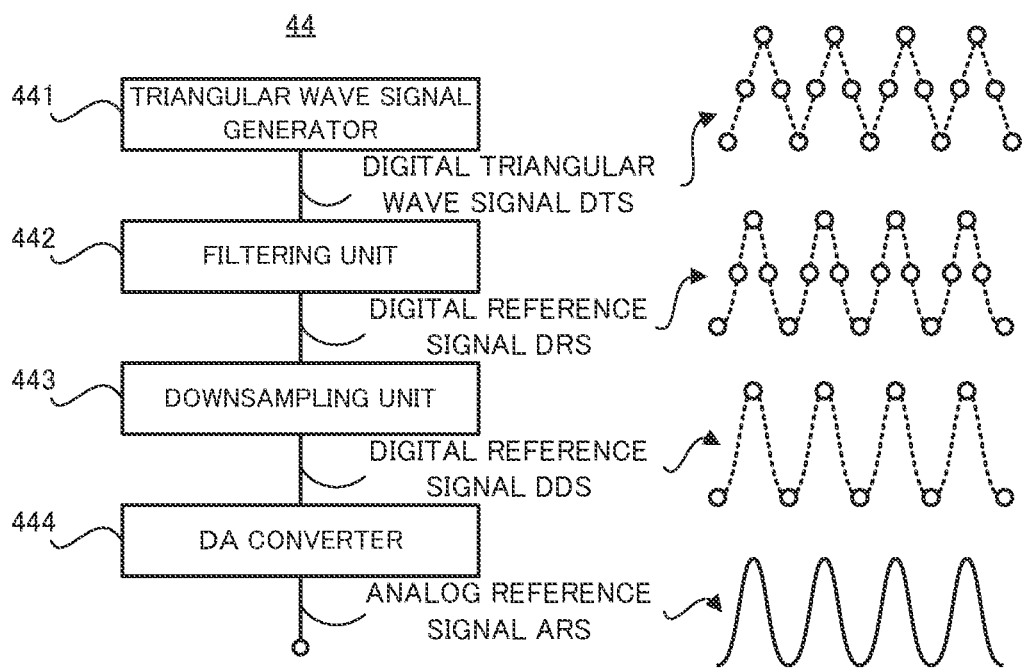
FIG. 5 is a block diagram illustrating a configuration of a reference signal generator along with a waveform of each signal generated by the reference signal generator.

An example of a configuration of the reference signal generator 44 that generates the analog reference signal ARS is illustrated in FIG. 5. As illustrated in FIG. 5, the reference signal generator 44 may include a triangular wave signal generator 441, a filtering unit 442, a downsampling unit 443, and a DA (Digital to Analog) converter 444.

The triangular wave signal generator 441 generates a digital triangular wave signal DTS. The digital triangular wave signal DTS is a digital electrical signal indicating a signal level of the analog triangular wave signal in discrete digital values. That is, the digital triangular wave signal DTS is a digital electrical signal indicating a sample value acquired by sampling the analog triangular wave signal at a predetermined sampling frequency, in discrete digital values.

The filtering unit 442 performs predetermined filtering on the digital triangular wave signal DTS generated by the triangular wave signal generator 441, thereby to generate a digital reference signal DRS that is a digital electrical signal. In the first example embodiment, the filtering performed by the filtering unit 442 includes filtering for removing from the digital triangular wave signal DTS the harmonic component to be removed. As a consequence, the digital reference signal DRS generated by the filtering is a digital electrical signal indicating the signal level of the analog reference signal ARS in discrete digital values. That is, the digital reference signal DRS is a digital electrical signal indicating the signal level of the analog electrical signal acquired by removing at least one harmonic signal component from the analog triangular wave signal, in discrete digital values.

An example of the filtering unit 442 includes a digital filter that may function as a low pass filter (LPF). In this case, a cut-off frequency of the low pass filter may be set in accordance with the frequency (high-order frequency) of the harmonic signal component to be removed from the triangular wave signal. That is, the cut-off frequency of the low pass filter may be set to a predetermined frequency that allows proper removal of the harmonic signal component to be removed, from the triangular wave signal.

The downsampling unit 443 performs predetermined downsampling on the digital reference signal DRS generated by the filtering unit 442, thereby to generate a digital reference signal DDS that is a digital electrical signal. That is, the downsampling unit 443 generates, from the digital reference signal DRS corresponding to a digital electrical signal sampled at a first sampling frequency, the digital reference signal DDS corresponding to a digital electrical signal sampled at a second sampling frequency that is lower than the first sampling frequency.

The DA converter 444 converts the digital reference signal DDS that is a digital electrical signal, to the analog reference signal ARS that is an analog electrical signal. That is, the DA converter 444 converts the digital reference signal DDS to an analog electrical signal, thereby to generate the analog reference signal ARS corresponding to the converted analog electrical signal. The analog reference signal ARS generated by the DA converter 444 is inputted to the signal modulator 43.

When a sampling frequency of the DA converter 444 is greater than or equal to a predetermined sampling frequency that allows the digital reference signal DRS that is not downsampled, to be converted to the analog reference signal ARS, the downsampling unit 443 may not perform the predetermined downsampling on the digital reference signal DRS. In this instance, the DA converter 444 may convert the digital reference signal DRS to the analog reference signal ARS. That is, the DA converter 444 may convert the digital reference signal DRS to an analog electrical signal, thereby to generate the analog reference signal ARS corresponding to the converted analog electrical signal.

Referring again to FIG. 2, the analog modulation signal AMS generated by the signal modulator 43 is inputted from the signal modulator 43 to the AD converter 51. The AD converter 51 performs AD conversion on the analog modulation signal AMS in order to convert the analog modulation signal AMS that is an analog electrical signal, to a digital uplink signal DUS that is a digital electrical signal. Consequently, the AD converter 51 generates the digital uplink signaling DUS. The digital uplink signal DUS corresponds to a signal acquired by converting the analog uplink signal AUS to a digital electrical signal. That is, the digital uplink signal DUS corresponds to a digital electrical signal indicating the signal level of the analog uplink signal AUS in discrete digital signal values.

The AD converter 51 may include a 1-bit AD converter and a digital filter. The 1-bit AD converter is an AD converter for converting an analog electrical signal to a digital electrical signal representing the signal level of the analog electrical signal by 1 bit. In this instance, the AD converter 51 may use the 1-bit AD converter to convert the analog modulation signal AMS to a provisional digital uplink signal that is a digital electrical signal representing the signal level of the analog modulation signal AMS by 1 bit. The AD converter 51 may then use the digital filter to convert the provisional digital uplink signal generated by the 1-bit AD converter to the digital uplink signal DUS that is a digital electrical signal representing the signal level of the analog uplink signal AUS by two or more bits.

Alternatively, the AD converter 51 may include a multibit AD converter and an analog filter. The multibit AD converter is an AD converter for converting an analog electrical signal to a digital electrical signal representing the signal level of the analog electrical signal by two or more bits. In this instance, the AD converter 51 may use the analog filter to extract, from the analog modulation signal AMS, an analog extraction signal that is an analog electrical signal including the signal component corresponding to the analog uplink signal AUS. The AD converter 51 may then use the multibit AD converter to convert the analog extraction signal generated by the analog filter to the digital uplink signal DUS that is a digital electrical signal representing the signal level of the analog uplink signal AUS by two or more bits.

Here, due to characteristics of the pulse width modulation, when the signal modulator 43 uses the triangular wave signal to perform the pulse width modulation, there is a small or almost no error between the digital uplink signal DUS actually generated by the AD converter 51 and an ideal digital uplink signal that is a digital signal acquired by performing the AD conversion directly on the analog uplink signal AUS. That is, the digital uplink signal DUS actually generated by the AD converter 51 is likely to be a digital signal representing the signal level of the analog uplink signal AUS exactly by two or more bits. In the first example embodiment, however, since the signal modulator 43 uses the analog reference signal ARS that is different from the triangular wave signal in order to perform the pulse width modulation, as illustrated in FIG. 3, the error between the digital uplink signal DUS actually generated by the AD converter 51 and the ideal digital uplink signal that is a digital electrical signal acquired by performing the AD conversion directly on the analog uplink signal AUS, may be greater than an allowable value. That is, as illustrated in FIG. 3, the digital uplink signal DUS actually generated by the AD converter 51 may not be a digital signal representing the signal level of the analog uplink signal AUS exactly by two or more bits. One of the reasons for causing the error is that the reference signal generator 44 that generates the analog reference signal ARS, substantially performs waveform conversion for converting the analog triangular wave signal to the analog reference signal ARS. That is, one of the reasons for causing the error is that the reference signal generator 44 substantially performs waveform conversion for converting the digital triangular wave signal DTS to the digital reference signal DRS (or the digital reference signal DDS).

The waveform conversion for converting the analog triangular wave signal to the analog reference signal ARS is equivalent to the waveform conversion for converting the digital triangular wave signal DTS to the digital reference signal DRS (or the digital reference signal DDS). Thus, in the following description, the waveform conversion is assumed to mean at least one of the waveform conversion for converting the analog triangular wave signal to the analog reference signal ARS, and the waveform conversion for converting the digital triangular wave signal DTS to the digital reference signal DRS (or the digital reference signal DDS).

Therefore, in the first example embodiment, in order to reduce or remove such an error, the nonlinear converter 52 performs nonlinear conversion corresponding to the waveform conversion substantially performed by the reference signal generator 44, on the digital uplink signal DUS generated by the AD converter 51. That is, the nonlinear converter 52 performs, on the digital uplink signal DUS, the nonlinear conversion that is digital signal conversion for reducing or removing the error that appears in the digital uplink signal DUS due to the waveform conversion substantially performed by the reference signal generator 44.

As is seen from FIG. 4, the waveform conversion for converting the analog triangular wave signal to the analog reference signal ARS is equivalent to an operation of generating the analog reference signal ARS by performing the nonlinear conversion of the waveform of the analog triangular wave signal. Similarly, as is seen from FIG. 5, the waveform conversion for converting the digital triangular wave signal DTS to the digital reference signal DRS (or the digital reference signal DDS) is equivalent to an operation of generating the digital reference signal DRS (or the digital reference signal DDS) by performing the nonlinear conversion of the waveform of the digital triangular wave signal DTS. Thus, if the digital uplink signal DUS is subjected to the same nonlinear conversion as the nonlinear conversion substantially performed on the triangular wave signal, the error that appears in the digital uplink signal DUS due to the waveform conversion substantially performed by the reference signal generator 44 is expected to be reduced or removed.

Therefore, the nonlinear converter 52 performs, on the digital uplink signal DUS, the same nonlinear conversion as the nonlinear conversion substantially performed on the triangular wave signal (i.e., the waveform conversion substantially performed by the reference signal generator 44). Consequently, the nonlinear converter 52 generates a digital uplink signal DCS that is the digital uplink signal DUS on which the nonlinear conversion is performed. As illustrated in FIG. 3, an error between the digital uplink signal DCS on which the nonlinear conversion is performed and the ideal digital uplink signal is smaller than the error between the digital uplink signal DUS on which the nonlinear conversion is not performed and the ideal digital uplink signal. That is, as illustrated in FIG. 3, the digital uplink signal DCS on which the nonlinear conversion is performed, is a digital signal representing the signal level of the analog uplink signal AUS, more accurately than the digital uplink signal DUS on which the nonlinear conversion is not performed. That is, the error that appears in the digital uplink signal DUS due to the waveform conversion substantially performed by the reference signal generator 44 is reduced or removed.

When a sample value at a time t of the digital uplink signal DUS is represented by a variable "$x_t$" and a sample value at the time t of the digital uplink signal DCS on which the nonlinear conversion is performed is represented by a variable "$y_t$", the nonlinear converter 52 may perform a polynomial arithmetic operation using a mathematical expression representing the sample value $y_t$ with a polynomial of the sample value $x_t$, as the nonlinear conversion. For example, the nonlinear converter 52 may perform a polynomial arithmetic operation using a mathematical expression of "$y_t = a_0 + a_1 \times x_t + a_2 \times x_t^2 + a_3 \times x_t^3 + \ldots$" as the nonlinear conversion. In this mathematical expression, "$a_k$ (wherein k is a variable indicating an integer of 1 or more)" is a coefficient of the polynomial, and may be determined in accordance with the content of the waveform conversion substantially performed by the reference signal generator 44.

The digital uplink signal DCS on which the nonlinear conversion is performed, is expected to have almost the same waveform as that of the analog uplink signal AUS as described above. That is, a spectral distribution of the digital uplink signal DCS on which the nonlinear conversion is performed, is expected to be narrower than a spectral distribution of the digital uplink signal DUS on which the nonlinear conversion is not performed. That is because, when wireless communication is performed, a spectrum of the analog uplink signal AUS normally broadens only as much as a desired signal bandwidth. Therefore, an example of a method of adjusting the parameter $a_k$ of the nonlinear converter 52 is a method of adjusting the parameter $a_k$ so as to reduce/control spectral broadening of the digital uplink signal DCS such that the spectral broadening of the digital uplink signal DCS on which the nonlinear conversion is performed is almost the same as spectral broadening of the analog uplink signal AUS.

Referring back to FIG. 2, the digital uplink signal DCS generated by the nonlinear converter 52 is inputted to the digital signal processing unit 53. The digital signal processing unit 53 performs predetermined digital signal processing on the digital uplink signal DCS. The digital signal processing may include a process of separating the digital uplink signal DCS into an I-axis signal component corresponding to an in-phase component (in other words, an In-Phase component and an I-axis component) of the radio uplink signal RUS, and a Q-axis signal component corresponding to a quadrature-phase component (in other words, a Quadrature-Phase component and a Q-axis component) of the radio uplink signal RUS. The digital signal processing may include a process of demodulating the digital uplink signal DCS (or the I-axis signal component and the Q-axis signal component).

<1-3> Technical Effect of Wireless Access System SYSa

As described above, in the wireless access system SYSa in the first example embodiment, the wireless station 1 uses the analog reference signal ARS acquired by removing at least one harmonic signal component from the triangular wave signal, in order to perform the pulse width modulation on the analog uplink signal AUS. For this reason, the frequency of the analog reference signal ARS is typically lower than that of the triangular wave signal. A frequency band of the analog reference signal ARS is typically narrower than that of the triangular wave signal. Thus, a sampling frequency required for the DA converter 444 to generate the analog reference signal ARS is typically lower than a sampling frequency required for the DA converter 444 to generate the triangular wave signal. Thus, a cost of the DA converter 444 for generating the analog reference signal ARS is typically lower than a cost of the DA converter 444 for generating the triangular wave signal. Therefore, the wireless access system SYSa is allowed to reduce the cost of the DA converter 444 for generating the analog reference signal ARS. Consequently, the wireless access system SYSa is allowed to reduce the cost of the pulse width modulations performed by using analog reference signal ARS.

Furthermore, in the wireless access system SYSa in the first example embodiment, the nonlinear converter 52 performs, on the digital uplink signal DUS, the same nonlinear conversion as the nonlinear conversion substantially performed by the reference signal generator 44 on the triangular wave signal. Thus, even when the analog reference signal ARS is used instead of the triangular wave signal to perform the pulse width modulation, the error that appears in the digital uplink signal DUS due to the waveform conversion substantially performed by the reference signal generator 44, is reduced or removed, as described above. Therefore, even when the analog reference signal ARS is used to perform the pulse width modulation, the wireless station 1 is allowed to generate the digital uplink signal DCS that is the same as the ideal digital uplink signal generated when the triangular wave signal is used to perform the pulse width modulation.

The reference signal generator 44 may take into account that an effect obtained by using the analog reference signal ARS to perform the pulse width modulation is a reduction in the sampling rate required for the DA converter 444.

As a first example, the reference signal generator 44 may generate, as the analog reference signal ARS, a signal acquired by removing from the triangular wave signal at least one harmonic signal component selected on the basis of such a criterion that "as the higher-order frequency becomes higher, the harmonic signal component is more preferentially removed." In this instance, the frequency of the analog reference signal ARS is more likely to be lower than the frequency of the triangular wave signal. Furthermore, the frequency band of the analog reference signal ARS is more likely to be narrower than the frequency band of the triangular wave signal. Therefore, the wireless access system SYSa is allowed to efficiently reduce a cost of the pulse width modulation performed by using the analog reference signal ARS.

As a second example, the reference signal generator 44 may generate, as the analog reference signal ARS, a signal acquired by removing from the triangular wave signal at least one harmonic signal component selected on the basis of an actual sampling frequency of the DA converter 444. For example, the reference signal generator 44 may generate, as the analog reference signal ARS, a signal acquired by removing from the triangular wave signal at least one harmonic signal component selected on the basis of such a criterion that "an upper limit of the higher-order frequency of the harmonic signal component left in the analog reference signal ARS is half the actual sampling frequency of the DA converter 444." For example, the reference signal generator 44 may generate, as the analog reference signal ARS, a signal acquired by removing from the triangular wave signal at least one harmonic signal component selected on the basis of such a criterion that "the higher-order frequency of the harmonic signal component left in the analog reference signal ARS is less than or equal to half the actual sampling frequency of the DA converter 444." In this instance, it is less likely that the reference signal generator 44 is not capable of generating the analog reference signal ARS by using the DA converter 444.

In order to maximize the effect of reducing the sampling frequency required for the DA converter 444 (i.e., the effect of reducing the cost of the DA converter 444), the reference signal generator 44 may generate, as the analog reference signal ARS, a signal acquired by removing from the triangular wave signal all the harmonic signal components included in the triangular wave signal. However, as the number of the harmonic signal components included in the analog reference signal ARS decreases, an arithmetic load required for the above-described nonlinear conversion increases. Therefore, the reference signal generator 44 may take into account a trade-off relation between the effect of reducing the cost of the DA converter 444, which is obtained by removing the harmonic signal component from the triangular wave signal, and the effect of reducing the arithmetic load required for the nonlinear conversion, which is obtained by leaving the harmonic signal component in the analog reference signal ARS, and may generate, as the analog reference signal ARS, a signal acquired by removing desired at least one harmonic signal component from the triangular wave signal.

<2> Wireless Access System SYS in Second Example Embodiment

Next, the wireless access system SYS in a second example embodiment will be described. In the following description, for convenience of description, the wireless access system SYS in the second example embodiment is referred to as a wireless access system SYSb.

The wireless access system SYSb in the second example embodiment is different from the wireless access system SYSa in the first example embodiment in that it includes a wireless station 1b instead of the wireless station 1. Other configurations of the wireless access system SYSb may be the same as those of the wireless access system SYSa.

Figure 6:
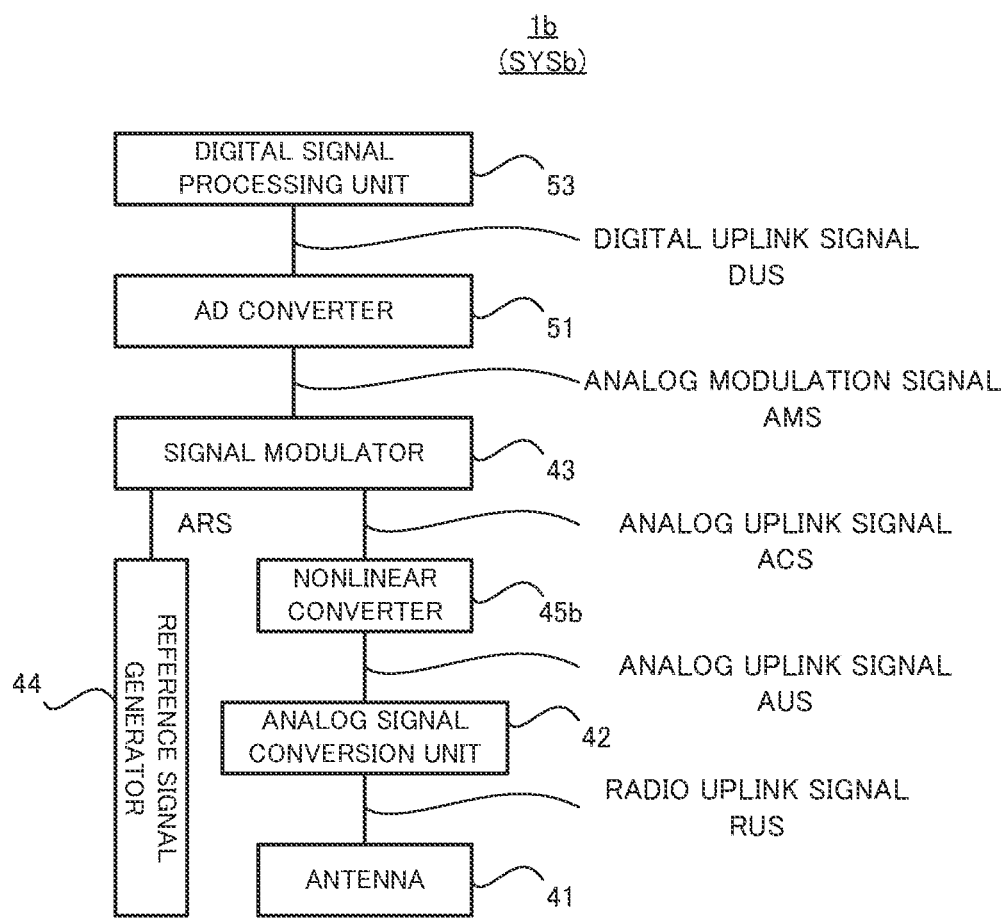
FIG. 6 is a block diagram illustrating a configuration of a wireless station in a second example embodiment.

Therefore, in the following, with reference to FIG. 6, the wireless station 1b in the second example embodiment will be described. FIG. 6 is a block diagram illustrating a configuration of the wireless station 1b according to the second example embodiment. In the following description, the already-described components carry the same reference numerals, and a detailed description thereof will be omitted.

As illustrated in FIG. 6, the wireless station 1b is different from the wireless station 1 in that it includes a nonlinear converter 45b instead of the nonlinear converter 52. Other configurations of the wireless station 1b may be the same as those of the wireless station 1.

The nonlinear converter 45b is different from the nonlinear converter 52 that performs the above-described nonlinear conversion on the digital uplink signal DUS that is a digital electrical signal, in the point that the nonlinear converter 45b performs the above-described nonlinear conversion on the analog uplink signal AUS that is an analog electrical signal. That is, the nonlinear converter 45b is different from the nonlinear converter 52, which performs, on the digital uplink signal DUS, the nonlinear conversion that is digital signal conversion for reducing or removing the error that appears in the digital uplink signal DUS due to the waveform conversion substantially performed by the reference signal generator 44, in the point that the nonlinear converter 45b performs, on the analog uplink signal AUS, the nonlinear conversion that is digital signal conversion for reducing or removing the error that appears in the digital uplink signal DUS due to the waveform conversion substantially performed by the reference signal generator 44. Consequently, the nonlinear converter 45b generates an analog uplink signal ACS that is the analog uplink signal AUS on which the nonlinear conversion is performed. Other configurations of the nonlinear conversion 45b are the same as those of the nonlinear transducer 52.

In this instance, instead of performing the predetermined modulation on the analog uplink signal AUS, the signal modulator 43 performs predetermined modulation on the analog uplink signal ACS, thereby to generate the analog modulation signal AMS. In addition, the AD converter 51 converts the analog modulation signal AMS to the digital uplink signal DUS. Here, since the above-described nonlinear conversion is already performed on the analog uplink signal AUS used to generate the analog modulation signal AMS, the digital uplink signal DUS generated by the AD converter 51 in the second example embodiment is equivalent to the digital uplink signal DCS generated by the nonlinear converter 52 in the first example embodiment. That is, in the digital uplink signal DUS generated by the AD converter 51 in the second example embodiment, the error that appears due to the waveform conversion substantially performed by the reference signal generator 44 is reduced or removed. Therefore, the digital signal processing unit 53 may perform the predetermined digital signal processing on the digital uplink signal DUS, in addition to performing the predetermined digital signal processing on the digital uplink signal DCS.

The wireless access system SYSb in the second example embodiment is allowed to enjoy the same effect as that of the wireless access system SYSa in the first example embodiment described above.

<3> Wireless Access System SYS in Third Example Embodiment

Next, the wireless access system SYS in a third example embodiment will be described. In the following description, for convenience of description, the wireless access system SYS in the third example embodiment is referred to as a wireless access system SYSc. The wireless access system SYSc in the third example embodiment is different from the wireless access system SYSa in the first example embodiment in that it includes a wireless station 1c instead of the wireless station 1. Other configurations of the wireless access system SYSc may be the same as those of the wireless access system SYSa.

Figure 7:
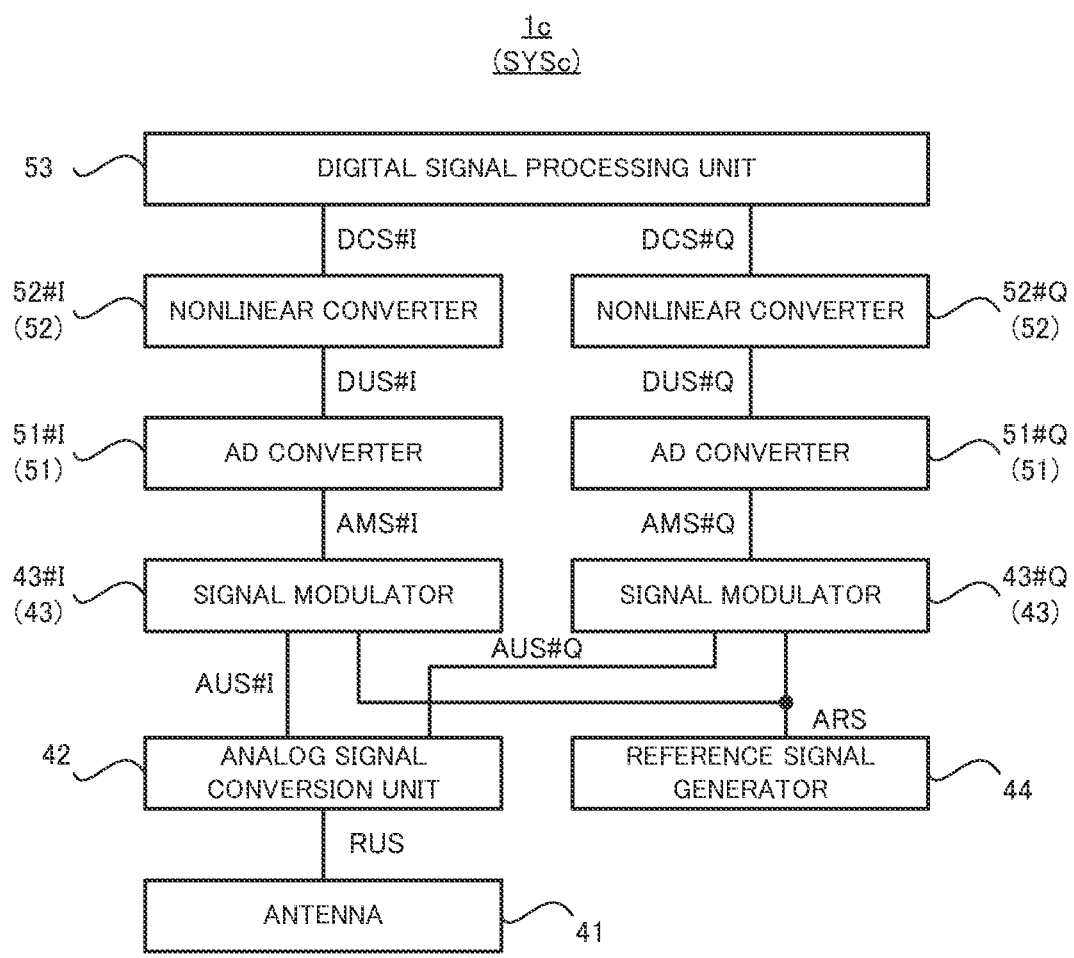
FIG. 7 is a block diagram illustrating a configuration of a wireless station in a third example embodiment.

Therefore, in the following, with reference to FIG. 7, the wireless station 1c in the third example embodiment will be described. FIG. 7 is a block diagram illustrating a configuration of the wireless station 1c according to the third example embodiment.

As illustrated in FIG. 7, the wireless station 1c is different from the wireless station 1 in that it includes two signal modulators 43, two AD converters 51, and two nonlinear converters 52. Specifically, the wireless station 1c includes signal modulators 43 #I and 43 #Q, AD converter 51 #I and 51 #Q, and nonlinear converters 52 #I and 52 #Q. Other configurations of the wireless station 1c may be the same as those of the wireless station 1.

Even in such a third example embodiment, as in the first example embodiment, the antenna 41 receives the radio uplink signaling RUS from the user terminal 2 through the wireless network 3. Thereafter, the analog signal conversion unit 42 performs the predetermined analog signal conversion on the radio uplink signal RUS, thereby to generate the analog uplink signal AUS.

Especially in the third example embodiment, the analog signal conversion includes IQ separation of generating, from the radio uplink signal RUS, each of the analog uplink signal AUS corresponding to the in-phase component of the radio uplink signal RUS (specifically, an analog uplink signal AUS #I) and the analog uplink signal AUS corresponding to the quadrature-phase component of the radio uplink signal RUS (specifically, an analog uplink signal AUS #Q). The IQ separation may be considered to be an operation of extracting the analog uplink signals AUS #I and AUS #Q from the radio uplink signal RUS. In this instance, the analog signal converting unit 42 may be referred to as a signal extraction unit. The analog uplink signal AUS #I generated by the analog signal conversion unit 42 is inputted from the analog signal conversion unit 42 to the signal modulator 43 #I. The analog uplink signal AUS #Q generated by the analog signal conversion unit 42 is inputted from the analog signal conversion unit 42 to the signal modulator 43 #Q The signal modulator 43 #I performs predetermined modulation on the analog uplink signal AUS #I, thereby to generate the analog modulation signal AMS (specifically, an analog modulation signal AMS #I). The signal modulator 43 #Q performs predetermined modulation on the analog uplink signal AUS #Q, thereby to generate the analog modulation signal AMS (specifically, an analog modulation signal AMS #Q).

The AD converter 51 #I performs the AD conversion on the analog modulation signal AMS #I, thereby to generate the digital uplink signal DUS (specifically, a digital uplink signal DUS #I). The digital uplink signal DUS #I corresponds to a digital electrical signal that indicates a signal level of the analog uplink signal AUS #I in discrete digital signal values.

The AD converter 51 #Q performs the AD conversion on the analog modulation signal AMS #Q, thereby to generate the digital uplink signal DUS (specifically, a digital uplink signal DUS #Q). The digital uplink signal DUS #Q corresponds to a digital electrical signal that indicates a signal level of the analog uplink signal AUS #Q in discrete digital signal values.

The nonlinear converter 52 #I performs the nonlinear conversion on the digital uplink signal DUS #I, thereby to generate the digital uplink signal DCS (specifically, a digital uplink signal DCS #I). The nonlinear converter 52 #Q performs the nonlinear conversion on the digital uplink signal DUS #Q, thereby to generate the digital uplink signal DCS (specifically, a digital uplink signal DCS #Q).

The digital signal processing unit 53 performs the predetermined digital signal processing on the digital uplink signals DCS #I and DCS #Q.

Thus, in the third example embodiment, the wireless access system SYSc is allowed to perform signal conversion using two signals generated by the IQ separation (specifically, the analog uplink signals AUS #I and AUS #Q). Here, a center frequency of the analog uplink signals AUS #I and AUS #Q generated by the IQ separation is typically lower than a center frequency of the analog uplink signal AUS in the first example embodiment generated without using the IQ separation. In some cases, the center frequency of the analog uplink signals AUS #I and AUS #Q generated by the IQ separation may be set to 0 Hz. Consequently, in the third example embodiment, limitations on performance (typically, limitations on a sampling period) required for the AD converter 51 to generate a more accurate digital uplink signal DUS are mitigated, compared with the first example embodiment.

The wireless access system SYSb in the second example embodiment described above may have a configuration that is distinctive of the wireless access system SYSc in the third example embodiment. The distinctive configuration of the wireless access system SYSc in the third example embodiment may include the configuration related to the IQ separation. In this instance, the wireless station 1b in the second example embodiment may include two signal modulators 43, two nonlinear converters 45b, and two AD converters 51. The two nonlinear converters 45b may respectively perform the nonlinear conversion on the analog uplink signals AUS #I and AUS #Q.

<4> Wireless Access System SYS in Fourth Example Embodiment

Next, the wireless access system SYS in a fourth example embodiment will be described. In the following description, for convenience of description, the wireless access system SYS in the fourth example embodiment is referred to as a wireless access system SYSd.

<4-1> Configuration of Wireless Access System SYSd in Fourth Example Embodiment

Figure 8:
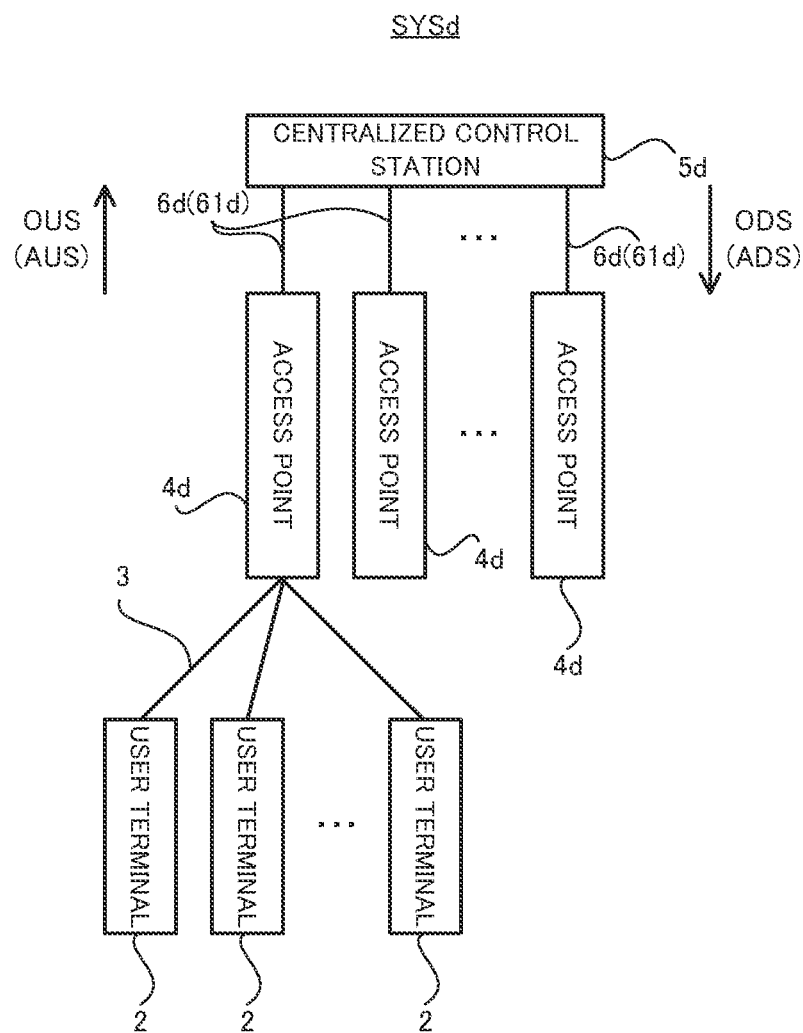
FIG. 8 is a block diagram illustrating a configuration of a wireless access system in a fourth example embodiment.

First, a configuration of the wireless access system SYSd in the fourth example embodiment will be described with reference to FIG. 8. FIG. 8 is a block diagram illustrating the configuration of the wireless access system SYSd according to the fourth: example embodiment.

As illustrated in FIG. 8, the wireless access system SYSd includes a centralized control station 5d and at least one access point 4d. Although FIG. 8 illustrates an example in which the wireless access system SYSd includes a plurality of access points 4d, the wireless access system SYSd may include a single access point 4d.

The centralized control station 5d and each access point 4d are connected through an optical network 6d. The optical network 6d is a network including an optical fiber 61d. For this reason, the centralized control station 5d generates an optical downlink signal ODS that is an optical signal, from the downlink signal to be transmitted from the centralized control station 5d to each access point 4d, and transmits the generated optical downlink signal ODS to each access point 4d through the optical network 6d. Similarly, each access point 4d generates an optical uplink signal OUS that is an optical signal, from the uplink signal to be transmitted from each access point 4d to the centralized control station 5d, and transmits the generated optical uplink signal OUS to the centralized control station 5d through the optical network 6d.

In the fourth example embodiment, the centralized control station 5d and each access point 4d may transmit the signals by using a RoF (Radio over Fiber) technique/technology. In this instance, the centralized control station 5d may modulate (e.g., perform intensity modulation on) the optical signal on the basis of the analog downlink signal ADS to be transmitted from the centralized control station 5d to each access point 4d, thereby to generate the modulated optical signal as the optical downlink signal ODS. Similarly, each access point 4d may modulate (e.g., perform intensity modulation on) the optical signal on the basis of the analog uplink signal AUS to be transmitted from each access point 4d to the centralized control station 5d, thereby to generate the modulated optical uplink signal OUS.

Each access point 4d is configured to communicate wirelessly with at least one user terminal 2 through the wireless network 3. For example, each access point 4d may generate a radio downlink signal on the basis of the analog downlink signal ADS received from the centralized control station 5d, and may transmit the radio downlink signal to the user terminal 2 through the wireless network 3. For example, each access point 4d may receive the radio uplink signal RUS from the user terminal 2 through the wireless network 3, may generate the analog uplink signal AUS on the basis of the radio uplink signal RUS, and may transmit the analog uplink signal AUS to the centralized control station 5d.

Such a wireless access system SYSd may typically be used for a mobile communication system. For example, the wireless access system SYSd may be used for a fifth-generation mobile communication system that meets "IMT-2020" specifications issued by ITU (International Telecommunication Union). For example, the wireless access system SYSd may be used for a mobile communication system referred to as Beyond 5G. In this instance, the centralized control station 5d that functions as a so-called base station, and the access point 4d that includes a baseband circuit and an antenna, are geographically and functionally separable. Consequently, a plurality of small cells respectively realized by the plurality of access points 4d, may be developed or deployed in a conventional microcell at a high density.

The centralized control station 5d may be referred to as a center unit, an aggregate station, or a baseband unit. The access point 4d may be referred to as a remote unit, an extension station, or a remote wireless unit.

<4-2> Signal Conversion Method Performed by Using Wireless Access System SYSd

Next, a signal conversion method performed by using the wireless access system SYSd will be described. Especially in the following, a signal conversion method performed by using the wireless access system SYSd will be described with reference to FIG. 9, which is a block diagram illustrating configurations of the centralized control station 5d and the access point 4d.

Furthermore, for convenience of description, a signal conversion method performed to transmit the uplink signal will be described below. That is, the signal conversion method performed to transmit the uplink signal from the access point 4d to the centralized control station 5d will be described. As a signal conversion method performed to transmit the downlink signal from the centralized control station 5d to the access point 4d, an existing signal conversion method may be used.

Figure 9:
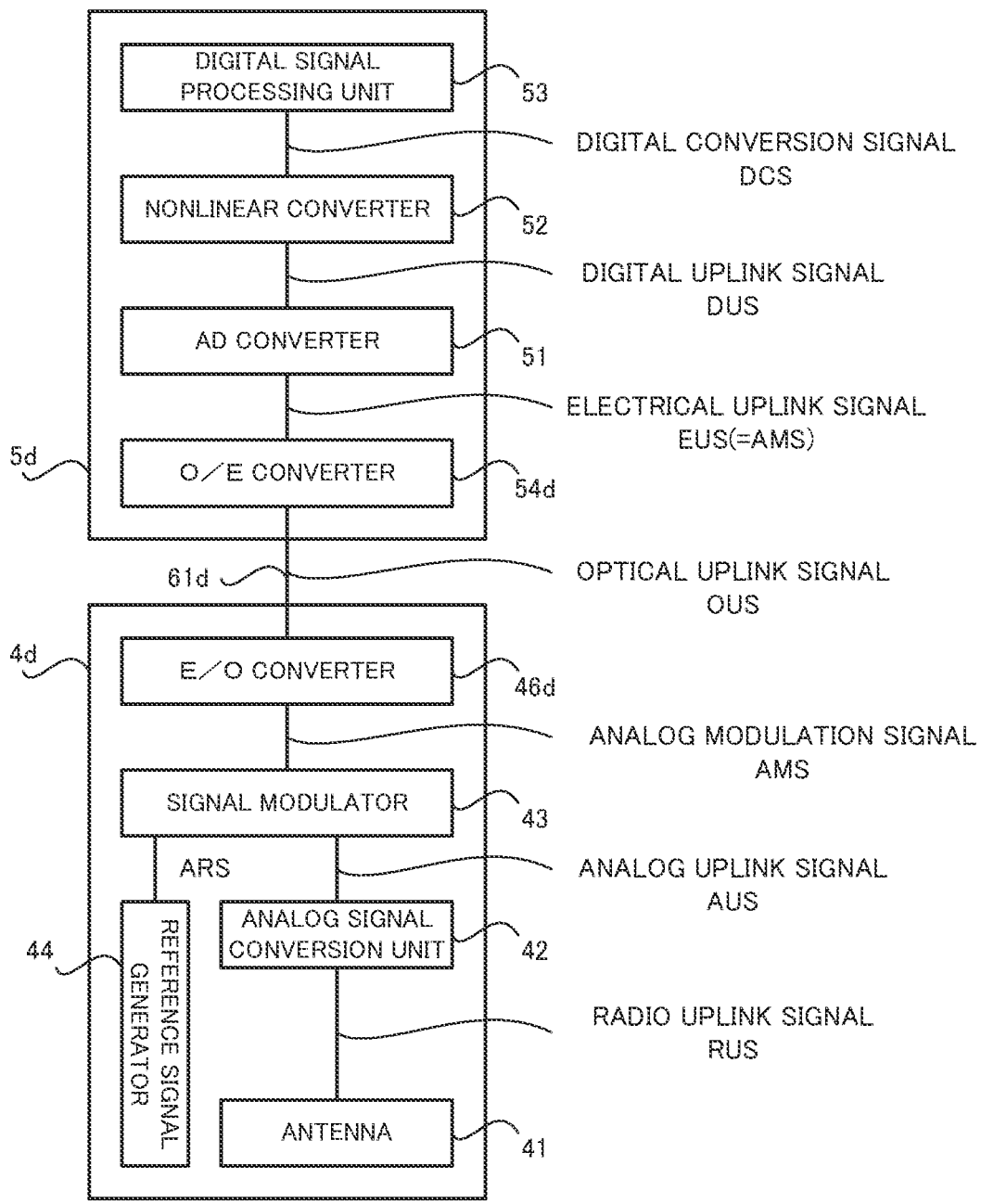
FIG. 9 is a block diagram illustrating configurations of a centralized control station, an access point, and an optical network in the fourth example embodiment.

As illustrated in FIG. 9, the access point 4d includes an E/O (Electrical to Optical) converter 46d in addition to the antenna 41, the analog signal conversion unit 42, the signal modulator 43, and the reference signal generator 44 described above. The centralized control station 5d includes an O/E (Optical to Electrical) converter 54d in addition to the AD converter 51, the nonlinear converter 52, and the digital signal processing unit 53 described above. The E/O converter 46d may be referred to as an "optical signal converter unit." The O/E converter 54d may be referred to as an "electrical signal conversion unit."

As illustrated in FIG. 9, the wireless access system SYSd in the fourth example embodiment may be regarded as different from the wireless access system SYSa in the first example embodiment in which the E/O converter 46d, the optical network 6d, and the O/E converter 54d are not used to transmit the analog modulation signal AMS from the signal converter 43 to the AD converter 51, in the point that the E/O converter 46d, the optical network 6d, and the O/E converter 54d are used to transmit the analog modulation signal AMS from the signal converter 43 to the AD converter 51.

Specifically, in the fourth example embodiment, the analog modulation signal AMS generated by the signal modulator 43 is inputted from the signal modulator 43 to the E/O converter 46d. The E/O converter 46d converts the analog modulation signal AMS that is an analog electrical signal, to the optical uplink signal OUS that is an optical signal. Specifically, the E/O converter 46d modulates (e.g., performs intensity-modulation on) the optical signal on the basis of the analog modulation signal AMS, thereby to generate the modulated optical signal as the optical uplink signal OUS. The optical uplink signal OUS generated by the E/O converter 46d is transmitted from the access point 4d to the centralized control station 5d through the optical network 6d.

Here, as described above, since the signal level of the analog modulation signal AMS at each time is one of the binary levels including a low level and a high level, an operation load of E/O converter 46d is reduced. Therefore, it is possible to reduce a cost of the E/O converter 46d.

The centralized control station 5d receives the optical uplink signal OUS transmitted from the access point 4d over the optical network 6d. The O/E converter 54d of the centralized control station 5d converts the optical uplink signal OUS that is an optical signal, to an electrical uplink signal EUS that is an analog electrical signal. The electrical uplink signal EUS is a signal equivalent to the analog modulation signal AMS. Therefore, the AD converter 51 is allowed to generate the digital uplink signal DUS from the electrical uplink signal EUS (i.e., from the analog modulation signal AMS), by using the electrical uplink signal EUS generated by the O/E converter 54d as the analog modulation signal AMS.

In addition, at least one of the wireless access system SYSb in the second example embodiment and the wireless access system SYSc in the third example embodiment described above may have a configuration that is distinctive of the wireless access system SYSd in the fourth example embodiment. The distinctive configuration of the wireless access system SYSd in the fourth example embodiment may include the configuration related to the centralized control station 5d, the access point 4d, and the optical network 6d.

<5> Wireless Access System SYS in Fifth Example Embodiment

Next, the wireless access system SYS in a fifth example embodiment will be described. In the following description, for convenience of description, the wireless access system SYS in the fifth example embodiment is referred to as a wireless access system SYSe. The wireless access system SYSe in the fifth example embodiment is different from the wireless access system SYSd in the fourth example embodiment in that it includes a centralized control station 5e, at least one access point 4e, and an optical network 6e, instead of the centralized control station 5d, the at least one access point 4d, and the optical network 6d. Other configurations of the wireless access system SYSe may be the same as those of the wireless access system SYSd.

Figure 10:
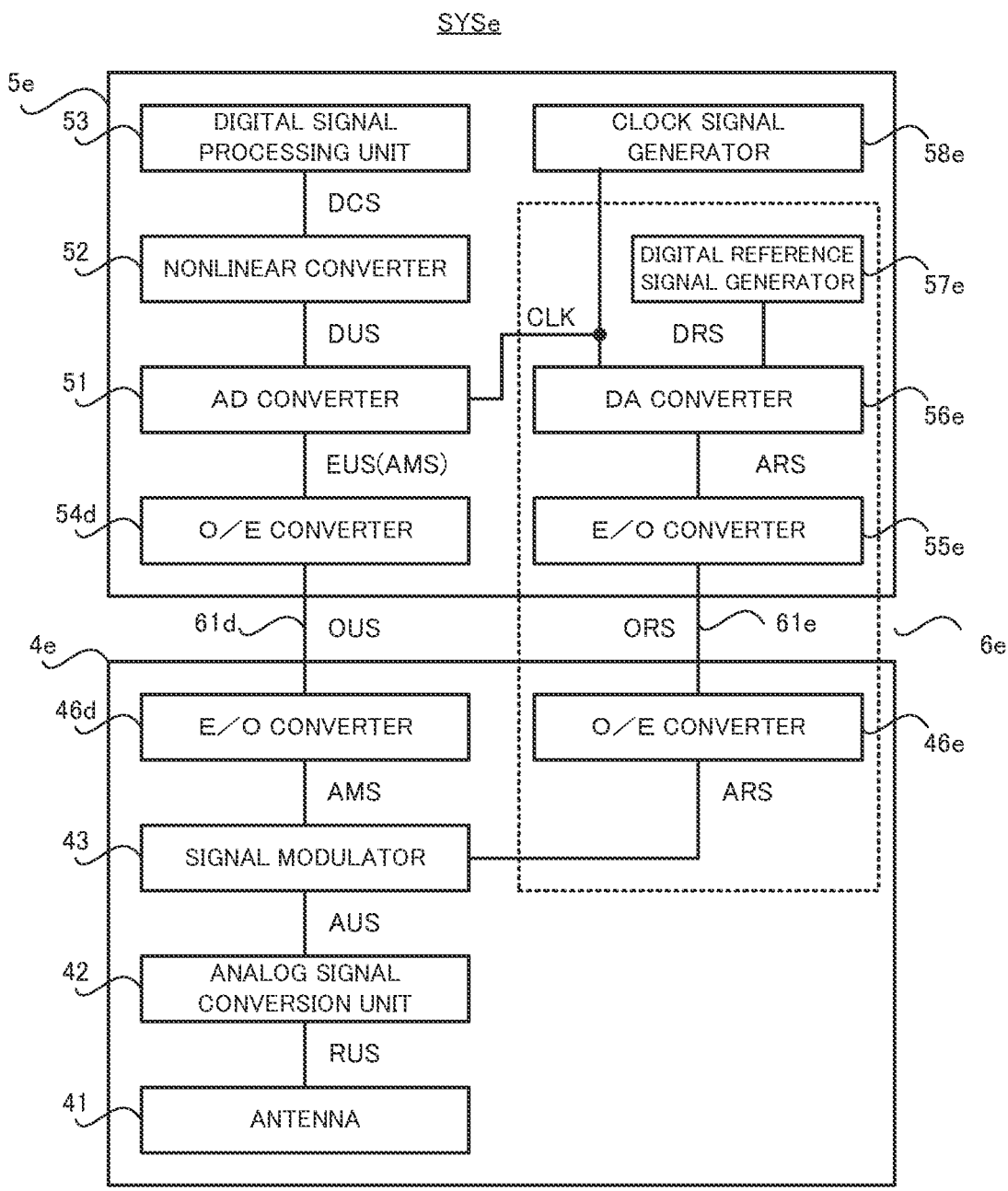
FIG. 10 is a block diagram illustrating configurations of a centralized control station, an access point, and an optical network in a fifth example embodiment.

Therefore, in the following, the centralized control station 5e, the at least one access point 4e, and the optical network 6e in the fifth example embodiment will be described with reference to FIG. 10. FIG. 10 is a block diagram illustrating configurations of the centralized control station 5e, the access point 4e, and the optical network 6e according to the fifth example embodiment.

As illustrated in FIG. 10, the centralized control station 5e is different from the centralized control station 5d in that it includes an E/O conversion 55e, a DA (Digital to Analog) converter 56e, a digital reference signal generator 57e, and a clocking signal generator 58e. Other configurations of the centralized control station 5e may be the same as those of the centralized control station 5d.

Additionally, the access point 4e is different from the access point 4d in that it may not include the reference signal generator 44. Furthermore, the access point 4e is different from the access point 4d in that it includes an O/E converter 46e. Other configurations of the access point 4e may be the same as those of the access point 4d.

Furthermore, the optical network 6e is different from the optical network 6d in that it further includes an optical fiber 61e. Other configurations of the optical network 6e may be the same as those of the optical network 6d.

Next, a signal conversion method performed by using the wireless access system SYSe in the fifth example embodiment will be described. In the following description, a difference between the signal conversion method performed by using the wireless access system SYSe in the fifth example embodiment and the signal conversion method performed by using the wireless access system SYSd in the fourth example embodiment will be mainly described. Therefore, unless otherwise described, the wireless access system SYSe may perform the same signal conversion method as the signal conversion method performed by using the wireless access system SYSd in the fourth example embodiment.

The signal conversion method performed by using the wireless access system SYSe in the fifth example embodiment is different from the signal conversion method performed by using the wireless access system SYSd in the fourth example embodiment in that the AD converter 51 of the centralized control station 5e converts the electrical uplink signal EUS (i.e., the analog modulation signal AMS) to the digital uplink signal DUS, in synchronization with a predetermined clock signal CLK generated by the clock signal generator 58e. For example, the AD converter 51 samples the electrical uplink signal EUS at each time when the sampling period specified by the clock signal CLK elapses, and outputs a digital signal indicating the signal level of the sampled electrical uplink signal EUS, as a part of the digital uplink signal DUS.

Furthermore, the signal conversion method performed by using the wireless access system SYSe in the fifth example embodiment is different from the signal conversion method performed by using the wireless access system SYSd in the fourth example embodiment in that the digital reference signal generator 57e generates the digital reference signal DRS. The digital reference signal generator 57e may includes the triangular wave signal generator 441 and the filtering unit 442 provided for the reference signal generator 44 described above, and may generate the digital reference signal DRS by using the triangular wave signal generator 441 and the filtering unit 442. The digital reference signal generator 57e further includes the downsampling unit 443 provided for the reference signal generator 44 described above, and may generate the digital reference signal DDS as the digital reference signal DRS, by using the downsampling unit 443 in addition to the triangular wave signal generator 441 and the filtering unit 442.

Furthermore, the signal conversion method performed by using the wireless access system SYSe in the fifth example embodiment is different from the signal conversion method performed by using the wireless access system SYSd in the fourth example embodiment in that the DA converter 56e converts the digital reference signal DRS to the analog reference signal ARS that is an analog electrical signal. In particular, the DA converter 56e converts the digital reference signal DRS to the analog reference signal ARS, in synchronization with a predetermined clock signal CLK generated by the clock signal generator 58e. That is, the DA converter 56e converts the digital reference signal DRS to the analog reference signal ARS, in synchronization with the clock signal CLK used by the AD converter 51 to generate the digital uplink signal DUS.

The DA converter 56e may include a 1-bit signal modulator and a 1-bit DA converter. The 1-bit signal modulator is a signal modulator for converting a digital signal to a digital signal that allows 1-bit signal processing (i.e., a digital signal in which a quantization bit number is 1 bit). The 1-bit DA converter is a DA converter for converting the digital signal that allows the 1-bit signal processing to an analog signal. In this case, the DA converter 56e may perform predetermined digital modulation on the digital reference signal DRS by using the 1-bit signal modulator, thereby to generate a digital output signal that is the digital signal that allows the 1-bit signal processing. An example of the digital modulation that is capable of generating the digital signal that allows the 1-bit signal processing, is at least one of pulse width modulation and $\Delta\Sigma$ modulation. Then, the DA converter 56e may use the 1-bit DA converter to convert the digital output signal to the analog reference signal ARS. Here, since the digital output signal generated by the 1-bit signal modulator is the digital signal that allows the 1-bit signal processing, the signal level of the analog reference signal ARS is substantially one of the binary levels including a low level and a high level. Consequently, operation loads of the E/O converter 55e and the O/E converter 46e that transmit the analog reference signal ARS are reduced. Therefore, it is possible to reduce costs of the E/O converter 55e and the O/E converter 46e.

Alternatively, the DA converter 56e may include a multibit DA converter. The multibit DA converter is a DA converter for converting a digital signal that allows multibit signal processing (i.e., a digital signal in which a quantization bit number is 2 bits or more) to an analog signal. In this instance, the DA converter 56e may use the multibit DA converter to convert the digital reference signal DRS to the analog reference signal ARS.

The analog reference signal ARS generated by the DA converter 56e is inputted from the DA converter 56e to the E/O converter 55e. The E/O converter 55e conversions the analog reference signal ARS that is an analog electrical signal, to an optical reference signal ORS that is an optical signal. Specifically, the E/O converter 55e modulates (e.g., performs intensity modulation on) the optical signal on the basis of the analog reference signal ARS, thereby to generate the modulated optical signal as the optical reference signal ORS. The optical reference signal ORS generated by the E/O converter 55e is transmitted from the centralized control station 5e to the access point 4e through the optical network 6: (especially, the optical fiber 61e).

The optical fiber 61e used to transmit the analog reference signal ARS from the centralized control station 5e to the access point 4e may be an optical fiber for transmitting the downlink signal to be transmitted from the centralized control station 5e to the access point 4e. In this instance, the centralized control station 5e may transmit the downlink signal to the access point 4e by using the optical fiber 61e, in a downlink transmission period when the downlink signal to be transmitted from the centralized control station 5e to the access point 4e should be transmitted. Meanwhile, the centralized control station 5e may not transmit the analog reference signal ARS to the access point 4e by using the optical fiber 61e in the downlink transmission period. On the other hand, the centralized control station 5e may transmit the analog reference signal ARS to the access point 4e by using optical fiber 61e, in a non-downlink transmission period when the downlink signal to be transmitted from the centralized control station 5e to the access point 4e may not be transmitted. In this instance, the wireless access system SYSe is allowed to transmit the analog reference signal ARS from the centralized control station 5e to the access point 4e, by using a transmission link (downlink) for transmitting the downlink signal. Therefore, the wireless access system SYSe may not include a dedicated transmission link for transmitting the analog reference signal ARS, and it is thus possible to reduce a cost of the wireless access system SYSe.

However, the optical fiber 61e used to transmit the analog reference signal ARS from the centralized control station 5e to the access point 4e may be an optical fiber that is different from the optical fiber for transmitting the downlink signal. That is, the optical fiber 61e used to transmit the analog reference signal ARS from the centralized control station 5e to the access point 4e may be a dedicated optical fiber for transmitting the analog reference signal ARS.

The O/E converter 46e converts the optical reference signal ORS that is an optical signal, to the analog reference signal ARS that is an analog electrical signal. That is, the O/E converter 46e restores the analog reference signal ARS that is converted to the optical reference signal ORS on the E/O converter 55e, from the optical reference signal ORS.

The analog reference signal ARS generated by the O/E converter 46e is inputted to the signal modulator 43. The signal modulator 43 performs predetermined modulation using the analog reference signal ARS generated by the O/E converter 46e, on the analog uplink signal AUS, thereby to generate the analog modulation signal AMS.

However, when the DA converter 56e converts the digital reference signal DRS to the analog reference signal ARS by using a 1-bit signal modulator and a 1-bit DA converter, the analog reference signal ARS generated by the O/E converter 46e may be inputted to the signal modulator 43 after passing through a low pass filter. Consequently, the signal modulator 43 may perform the predetermined modulation, by using the analog reference signal ARS from which a high-frequency noise component is removed by the low pass filter.

In the wireless access system SYSe in the fifth example embodiment described above, an apparatus including the digital reference signal generator 57e, the DA converter 56e, the E/O converter 55e, and the O/E converter 46e (and further, if desired, the low pass filter) mainly used for inputting the analog reference signal ARS to the signal modulator 43, may be regarded as functioning as the reference signal generator 44.

As described above, in the fifth example embodiment, the AD converter 51 that generates the digital uplink signal DUS, and the DA converter 56e that generates the analog reference signal ARS, operate at timing based on the same clock signal CLK. Furthermore, since the analog reference signal ARS is generated in synchronization with the clock signal CLK, it can be said that the signal modulator 43 that generates the analog modulation signal AMS by using the analog reference signal ARS also substantially operates at the timing based on the clock signal CLK. For this reason, the AD converter 51 may generate the analog uplink signal AUS in synchronization with the timing when the signal modulator 43 generates the analog uplink signal AUS. Therefore, it is possible to reduce an influence of jitter of the digital uplink DUS.

<6> Modified Example

Figure 11:
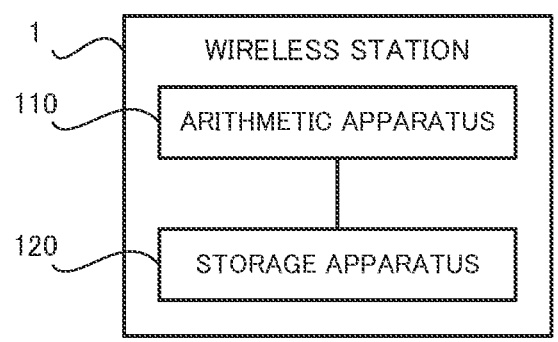
FIG. 11 is a block diagram illustrating another configuration of a wireless base station.

The above describes an example in which each of the analog signal conversion unit 42, the signal modulator 43, the reference signal generator 44, the AD converter 51, the nonlinear converter 52, and the digital signal processing unit 53 provided in the wireless station 1 is hardware; however, an operation performed by at least one of the analog signal conversion unit 42, the signal modulator 43, the reference signal generator 44, the AD converter 51, the nonlinear converter 52, and the digital signal processing unit 53 may be realized by software. For example, as illustrated in FIG. 11, the wireless station 1 may include an arithmetic apparatus 110 such as a CPU (Central Processing Unit), and a storage apparatus 120 such as a memory. The arithmetic apparatus 110 may execute a computer program recorded in the storage apparatus 120. Consequently, a logical processing block that performs the operation performed by at least one of the analog signal conversion unit 42, the signal modulator 43, the reference signal generator 44, the AD converter 51, the nonlinear converter 52, and the digital signal processing unit 53 may be realized or implemented in the arithmetic apparatus 110.

<7> Supplementary Notes

With respect to the example embodiments described above, the following Supplementary Notes are further disclosed.

[Supplementary Note 1]

A signal modulation apparatus including:
a reference signal generator that generates an analog reference signal by removing at least one harmonic signal component corresponding to at least one higher-order frequency from a triangular wave signal;
a modulation signal generator that performs pulse width modulation for comparing the analog reference signal with an analog input signal, thereby to generate an analog modulation signal;
a digital signal converter that converts the analog modulation signal to a digital output signal; and
a nonlinear converter that performs nonlinear conversion corresponding to waveform conversion for converting the triangular wave signal to the analog reference signal, on the digital output signal or the analog input signal.

[Supplementary Note 2]
The signal modulation apparatus according to Supplementary Note 1, wherein
the nonlinear converter performs the nonlinear conversion on the digital output signal, and
the signal modulation apparatus further includes a signal processer that performs digital signal processing on the digital output signal on which the nonlinear conversion is performed.

[Supplementary Note 3]
The signal modulation apparatus according to Supplementary Note 1 or 2, wherein
the nonlinear converter performs the nonlinear conversion on the analog input signal, and
the modulation signal generator performs the pulse width modulation for comparing the analog reference signal with the analog input signal on which the nonlinear conversion is performed, thereby to generate the analog modulation signal.

[Supplementary Note 4]
The signal modulation apparatus according to Supplementary Note 1 or 2, wherein
the signal modulation apparatus is configured to extract, from a radio signal received by an antenna, a first analog input signal corresponding to an in-phase component of the radio signal and a second analog input signal corresponding to a quadrature-phase component of the radio signal,
the modulation signal generator includes: a first modulator that performs the pulse width modulation for comparing the analog reference signal with the first analog input signal, thereby to generate a first analog modulation signal; and a second modulator that performs the pulse width modulation for comparing the analog reference signal with the second analog input signal, thereby to generate a second analog modulation signal,
the digital signal converter includes: a first digital signal converter that converts the first analog modulation signal to a first digital output signal; and a second digital signal converter that converts the second analog modulation signal to a second digital output signal, and
the nonlinear converter includes: a first nonlinear converter that performs the nonlinear conversion on the first digital output signal or the first analog input signal; and a second nonlinear converter that performs the nonlinear conversion on the second digital output signal or the second analog input signal

[Supplementary Note 5]
The signal modulation apparatus according to Supplementary Note 1 or 2, wherein
the signal modulation apparatus includes:
an optical signal converter that converts the analog modulation signal to an optical signal;
an optical network in which the optical signal converted by the optical signal converter is transmitted; and
an electrical signal converter that converts the optical signal transmitted through the optical network to an electrical signal, thereby to restore the analog modulation signal, and
the digital signal converter converts the analog modulation signal converted by the electrical signal converter, to the digital output signal.

[Supplementary Note 6]
The signal modulation apparatus according to Supplementary Note 1 or 2, wherein
the signal modulation apparatus is a wireless communication system including: a centralized control station; and an access point connected to the centralized control station through an optical network,
the access point includes: the reference signal generator; the modulation signal generator; and an optical signal converter that converts the analog modulation signal generated by the modulation signal generator, to an optical signal,
the centralized control station includes: an electrical signal converter that converts the optical signal transmitted from the access point through the optical network, to an electrical signal, thereby to restore the analog modulation signal; and the digital signal converter, and
the digital signal converter converts the analog modulation signal converted by the electrical signal converter, to the digital output signal.

[Supplementary Note 7]
The signal modulation apparatus according to Supplementary Note 1 or 2, wherein
the digital signal converter converts the analog modulation signal to the digital output signal in synchronization with a predetermined clock signal, and
the reference signal generator generates the analog reference signal in synchronization with the clock signal.

[Supplementary Note 8]
The signal modulation apparatus according to Supplementary Note 7, wherein
the signal modulation apparatus is a wireless communication system including: a centralized control station; and an access point connected to the centralized control station through an optical network,
the reference signal generator includes:
a first signal generator that is disposed in the centralized control station, and that generates an analog downlink signal whose signal level changes between a high level and a low level on the basis of a digital reference signal corresponding to the analog reference signal;
an optical signal converter that is disposed in the centralized control station, and that converts the analog downlink signal generated by the first signal generator, to an optical downlink signal;
an electrical signal converter that is disposed in the access point, and that converts the optical downlink signal transmitted from the centralized control station through the optical network, to an electrical downlink signal; and
a second signal generator that is disposed in the access point, and that generates the analog reference signal from the electrical downlink signal.

[Supplementary Note 9]
The signal modulation apparatus according to Supplementary Note 8, wherein the reference signal generator transmits the optical downlink signal from the centralized control station to the access point through the optical network, in a period that is different from a period in which a downlink transmission signal to be transmitted to the access point by the centralized control station is transmitted from the centralized control station to the access point through the optical network.

[Supplementary Note 10]
A signal modulation method including:
generating an analog reference signal by removing at least one harmonic signal component corresponding to at least one higher-order frequency from a triangular wave signal;
performing pulse width modulation for comparing the analog reference signal with an analog input signal, thereby to generate an analog modulation signal;

converting the analog modulation signal to a digital output signal; and performing nonlinear conversion corresponding to waveform conversion for converting the triangular wave signal to the analog reference signal, on the digital output signal or the analog input signal.

This disclosure is not limited to the above-described examples and is allowed to be changed, if desired, without departing from the essence or spirit of the invention which can be read from the claims and the entire specification. A signal modulation apparatus and a signal modulation method with such changes, are also included in the technical concepts of this disclosure.

DESCRIPTION OF REFERENCE NUMERALS

SYS Wireless access system
1 Centralized control station
11 O/E converter
12 Analog filter
13 Multibit AD converter
14 Digital signal processing unit
2 Access point
21 Antenna
22 Analog signal conversion unit
23 Signal modulator
24 Reference signal generator
25 E/O converter
3 Optical network
31 Optical fiber

What is claimed is:

1. A signal modulation apparatus comprising:
a reference signal generator configured to generate an analog reference signal by performing a predetermined nonlinear transformation to remove at least one harmonic signal component corresponding to at least one higher-order frequency from a triangular wave signal;
a modulation signal generator configured to perform pulse width modulation for comparing the analog reference signal with an analog input signal, thereby to generate an analog modulation signal;
a digital signal converter configured to convert the analog modulation signal to a digital output signal; and
a nonlinear converter configured to perform nonlinear conversion, corresponding to the predetermined nonlinear transformation, on the digital output signal or the analog input signal.

2. The signal modulation apparatus according to claim 1, wherein
the nonlinear converter performs the nonlinear conversion on the digital output signal, and
the signal modulation apparatus further comprises a signal configured to perform digital signal processing on the digital output signal on which the nonlinear conversion is performed.

3. The signal modulation apparatus according to claim 1, wherein
the nonlinear converter performs the nonlinear conversion on the analog input signal, and
the modulation signal generator performs the pulse width modulation for comparing the analog reference signal with the analog input signal on which the nonlinear conversion is performed to generate the analog modulation signal.

4. The signal modulation apparatus according to claim 1, wherein
the signal modulation apparatus is configured to extract, from a radio signal received by an antenna, a first analog input signal corresponding to an in-phase component of the radio signal and a second analog input signal corresponding to a quadrature-phase component of the radio signal,
the modulation signal generator comprises: a first modulator configured to perform the pulse width modulation for comparing the analog reference signal with the first analog input signal to generate a first analog modulation signal; and a second modulator configured to perform the pulse width modulation for comparing the analog reference signal with the second analog input signal to generate a second analog modulation signal,
the digital signal converter comprises: a first digital signal converter configured to convert the first analog modulation signal to a first digital output signal;
and a second digital signal converter configured to convert the second analog modulation signal to a second digital output signal, and
the nonlinear converter comprises: a first nonlinear converter configured to perform the nonlinear conversion on the first digital output signal or the first analog input signal; and a second nonlinear converter configured to perform the nonlinear conversion on the second digital output signal or the second analog input signal.

5. The signal modulation apparatus according to claim 1, wherein
the signal modulation apparatus further comprises:
an optical signal converter configured to convert the analog modulation signal to an optical signal;
an optical network in which the optical signal converted by the optical signal converter is transmitted; and
an electrical signal converter configured to convert the optical signal transmitted through the optical network to an electrical signal, thereby to restore the analog modulation signal, and
the digital signal converter converts the analog modulation signal converted by the electrical signal converter, to the digital output signal.

6. The signal modulation apparatus according to claim 1, wherein
the signal modulation apparatus is a wireless communication system comprising: a centralized control station; and an access point connected to the centralized control station through an optical network,
the access point comprises: the reference signal generator; the modulation signal generator; and an optical signal converter that converts the analog modulation signal generated by the modulation signal generator, to an optical signal,
the centralized control station comprises: an electrical signal converter configured to convert the optical signal transmitted from the access point through the optical network, to an electrical signal to restore the analog modulation signal; and the digital signal converter, and
the digital signal converter converts the analog modulation signal converted by the electrical signal converter, to the digital output signal.

7. The signal modulation apparatus according to claim 1, wherein
the digital signal converter converts the analog modulation signal to the digital output signal in synchronization with a predetermined clock signal, and
the reference signal generator generates the analog reference signal in synchronization with the clock signal.

8. The signal modulation apparatus according to claim 7, wherein
the signal modulation apparatus is a wireless communication system comprising: a centralized control station; and an access point connected to the centralized control station through an optical network,
the reference signal generator comprising:
a first signal generator disposed in the centralized control station, and configured to generate an analog downlink signal whose signal level changes between a high level and a low level on the basis of a digital reference signal corresponding to the analog reference signal;
an optical signal converter disposed in the centralized control station, and configured to convert the analog downlink signal generated by the first signal generator, to an optical downlink signal;
an electrical signal converter disposed in the access point, and configured to convert the optical downlink signal transmitted from the centralized control station through the optical network, to an electrical downlink signal; and
a second signal generator disposed in the access point, and configured to generate the analog reference signal from the electrical downlink signal.

9. The signal modulation apparatus according to claim 8, wherein the reference signal generator transmits the optical downlink signal from the centralized control station to the access point through the optical network, in a period that is different from a period in which a downlink transmission signal to be transmitted to the access point by the centralized control station is transmitted from the centralized control station to the access point through the optical network.

10. A signal modulation method comprising:
generating an analog reference signal by performing a predetermined nonlinear transformation to remove at least one harmonic signal component corresponding to at least one higher-order frequency from a triangular wave signal;
performing pulse width modulation for comparing the analog reference signal with an analog input signal, thereby to generate an analog modulation signal;
converting the analog modulation signal to a digital output signal; and
performing nonlinear conversion, corresponding to the predetermined nonlinear transformation, on the digital output signal or the analog input signal.

* * * * *